(12) United States Patent
Rofougaran et al.

(10) Patent No.: US 8,086,192 B2
(45) Date of Patent: Dec. 27, 2011

(54) METHOD AND SYSTEM FOR POWER CONTROL WITH OPTIMUM POWER EFFICIENCY WITH A MULTI-PORT DISTRIBUTED ANTENNA

(75) Inventors: Ahmadreza Rofougaran, Newport Coast, CA (US); Maryam Rofougaran, Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 497 days.

(21) Appl. No.: 12/396,964

(22) Filed: Mar. 3, 2009

(65) Prior Publication Data
US 2010/0227575 A1    Sep. 9, 2010

(51) Int. Cl.
*H04B 1/04* (2006.01)
(52) U.S. Cl. ............... 455/127.1; 455/571; 455/343.1
(58) Field of Classification Search ........... 455/127.1, 455/127.2, 127.3, 343.1, 343.5, 572, 574
See application file for complete search history.

(56) References Cited

U.S. PATENT DOCUMENTS
6,314,305 B1 * 11/2001 Solondz et al. ............ 455/562.1
* cited by examiner

*Primary Examiner* — An Luu
(74) *Attorney, Agent, or Firm* — McAndrews, Held & Malloy, Ltd.

(57) ABSTRACT

Methods and systems for power control with optimum power efficiency with a multi-port distributed antenna are disclosed and may include selectively enabling one or more power amplifiers (PAs) coupled to the antenna. The selective enabling may be based on a desired output power radiated from the antenna, and the PAs may be coupled to ports on the antenna based on an output impedance of the PAs and a characteristic impedance of the ports. Each of the PAs may be configured for maximum efficiency in different power ranges. The power ranges may be inversely proportional to the output impedance of the PAs. The output power may be monitored utilizing a power detector, such as an envelope detector, coupled to the antenna. The antenna may be integrated on a chip with the one or more PAs or may be located external to the chip. The antenna may include a microstrip antenna.

20 Claims, 6 Drawing Sheets

METHOD AND SYSTEM FOR POWER CONTROL WITH OPTIMUM POWER EFFICIENCY WITH A MULTI-PORT DISTRIBUTED ANTENNA

CROSS-REFERENCE TO RELATED APPLICATIONS/INCORPORATION BY REFERENCE

This application makes reference to:
U.S. patent application Ser. No. 12/367,892 filed on Feb. 9, 2009;
U.S. patent application Ser. No. 12/396,935 filed on even date herewith;
U.S. patent application Ser. No. 12/397,005 filed on even date herewith; and
U.S. patent application Ser. No. 12/397,024 filed on even date herewith;
U.S. patent application Ser. No. 12/397,040 filed on even date herewith;
U.S. patent application Ser. No. 12/397,060 filed on even date herewith; and
U.S. patent application Ser. No. 12/397,096 filed on even date herewith.

Each of the above stated applications is hereby incorporated herein by reference in its entirety.

FEDERALLY SPONSORED RESEARCH OR DEVELOPMENT

[Not Applicable]

Microfiche/Copyright Reference

[Not Applicable]

FIELD OF THE INVENTION

Certain embodiments of the invention relate to wireless communication. More specifically, certain embodiments of the invention relate to a method and system for power control with optimum power efficiency with a multi-port distributed antenna.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for power control with optimum power efficiency with a multi-port distributed antenna, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for power control with optimum power efficiency with a multi-port distributed antenna. Exemplary aspects of the invention may comprise selectively enabling one or more power amplifiers coupled to a multi-port distributed antenna in a wireless device. The selective enabling may be based on a desired output power radiated from the multi-port distributed antenna, and the power amplifiers may be coupled to ports on the multi-port distributed antenna based on an output impedance of the power amplifiers and a characteristic impedance of the ports on the multi-port distributed antenna. Each of the power amplifiers may be configured for maximum efficiency in different output power ranges. The output power ranges may be inversely proportional to the output impedance of the power amplifiers. The output power may be monitored utilizing a power detector coupled to the multi-port distributed antenna. The power detector may comprise an envelope detector, such as a diode. The multi-port distributed antenna may be integrated on a chip with the one or more power amplifiers or may be located external to the chip. The multi-port distributed antenna may comprise a microstrip antenna. RF signals may be transmitted via the one or more selectively enabled power amplifiers and the multi-port distributed antenna.

Figure 1:
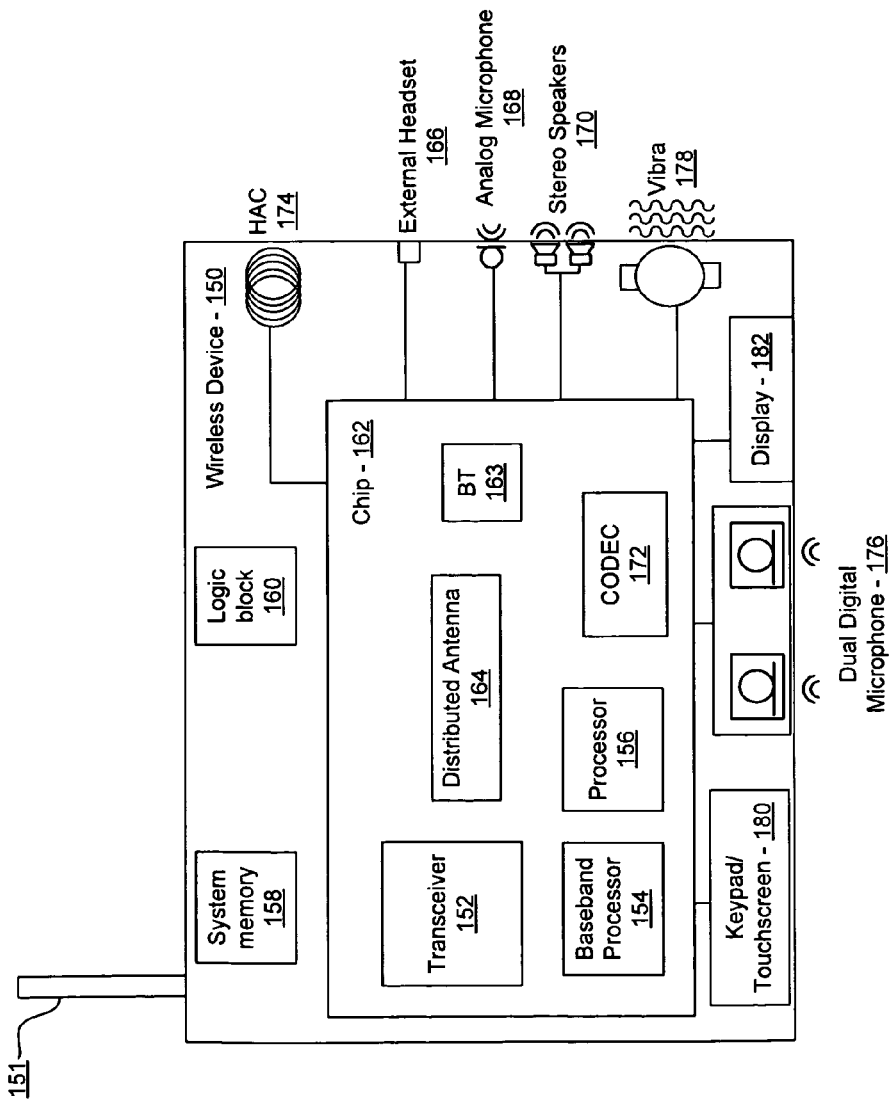
FIG. 1 is a block diagram of an exemplary wireless system, which may be utilized in accordance with an embodiment of the invention.

FIG. 1 is a block diagram of an exemplary wireless system, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, a distributed antenna 164, and an external headset port 166. The wireless device 150 may also comprise an analog microphone 168, integrated hands-free (IHF) stereo speakers 170, a hearing aid compatible (HAC) coil 174, a dual digital microphone 176, a vibration transducer 178, a keypad and/or touchscreen 180, and a display 182. The wireless device 150 may comprise a wireless communication device such as a cellphone or a smartphone.

The transceiver 152 may comprise suitable logic, circuitry, and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the distributed antenna 164. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, UMTS, BLUETOOTH, and ZIGBEE, for example.

The baseband processor 154 may comprise suitable logic, circuitry, and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, I$^2$S FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The audio CODEC 172 may utilize a programmable infinite impulse response (IIR) filter and/or a programmable finite impulse response (FIR) filter for at least a portion of the audio sources to compensate for passband amplitude and phase fluctuation for different output devices. In this regard, filter coefficients may be configured or programmed dynamically based on current operations. Moreover, the filter coefficients may be switched in one-shot or may be switched sequentially, for example. The CODEC 172 may also utilize a modulator, such as a Delta-Sigma (Δ-Σ) modulator, for example, to code digital output signals for analog processing.

The chip 162 may comprise an integrated circuit with multiple functional blocks integrated within, such as the transceiver 152, the processor 156, the baseband processor 154, the BT radio/processor 163, the CODEC 172, and the distributed antenna 164. The number of functional blocks integrated in the chip 162 is not limited to the number shown in FIG. 1. Accordingly, any number of blocks may be integrated on the chip 162 depending on chip space and wireless device 150 requirements, for example.

The distributed antenna 164 may comprise a plurality of ports for coupling signals in and/or out of the distributed antenna 164, and may be integrated in and/or on the chip 162. The physical dimensions of the distributed antenna 164 may be configured to optimize a frequency of operation and/or characteristic impedance at the plurality of ports. A plurality of power amplifiers in the transceiver 152 may be coupled to the plurality of ports to enable power efficiency configuration. In instances where high power may be desired, one or more low output impedance PAs designed for high power operation may be coupled to low impedance ports on the distributed antenna 164 and enabled to amplify received RF signals before communicating them to the distributed antenna 164. Similarly, for low power operation, one or more higher impedance PAs optimized for lower power operation may be coupled to high impedance ports of the distributed antenna 164.

The external headset port 166 may comprise a physical connection for an external headset to be communicatively coupled to the wireless device 150. The analog microphone 168 may comprise suitable circuitry, logic, and/or code that may detect sound waves and convert them to electrical signals via a piezoelectric effect, for example. The electrical signals generated by the analog microphone 168 may comprise analog signals that may require analog to digital conversion before processing.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The wireless signals may be transmitted by the distributed antenna 164 which may comprise a plurality of input/output ports. The characteristic impedance seen by a PA coupled to a particular port may be configured by the physical dimensions and by which of the plurality of ports the device may be coupled to, for example.

In an embodiment of the invention, one or more PAs may be coupled to appropriate ports on the distributed antenna 164 to enable configuration of the efficiency of the power radiated by the distributed antenna 164. For high power operation, a low impedance/high power PA may be coupled to low impedance ports of the distributed antenna 164, resulting in the efficient transmission of RF signals. Similarly, for low power applications, one or more higher output impedance PAs coupled to the high impedance ports on the distributed antenna 164 may be enabled for efficient transmission of low power RF signals. The PAs may be enabled by the processor 156 or the baseband processor 154, for example, and may comprise variable gain amplifiers allowing for further control of the output power of the distributed antenna 164, and enabling efficient power control in the wireless device 150 thereby enhancing battery life and system performance.

Figure 2:
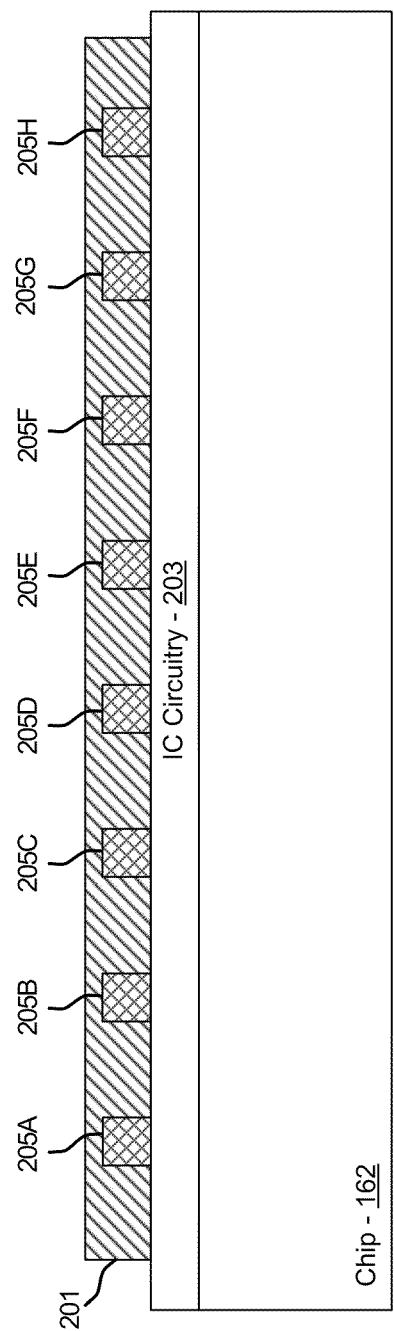
FIG. 2 is a block diagram illustrating an exemplary multi-port distributed antenna on a chip, in accordance with an embodiment of the invention.

FIG. 2 is a block diagram illustrating an exemplary multi-port distributed antenna on a chip, in accordance with an embodiment of the invention. Referring to FIG. 2, there is shown the chip 162, a distributed antenna 201, IC circuitry 203, and antenna ports 205A-205H. The chip 162 may be as described with respect to FIG. 1. The IC circuitry 203 may comprise devices integrated in the chip 162, such as the transceiver 152, the processor 156, and the baseband processor 154, for example. The chip 162 comprising the multiport distributed antenna 164 may be integrated with the wireless device 150.

The distributed antenna 201, which may be substantially similar to the distributed antenna 164 described with respect to FIG. 1, may comprise an antenna integrated in and/or on the chip 162 that may comprise a plurality of ports, the antenna ports 205A-205H, such that driver circuitry may be coupled to appropriate points along the distributed antenna 201. For example, PAs may be coupled to ports that exhibit appropriate characteristic impedance. The distributed antenna 201 may comprise a microstrip or coplanar waveguide, for example.

The antenna ports 205A-205H may comprise electrical contacts along the length of the distributed antenna 201 that may enable coupling to the antenna at a plurality of points. In this manner, PAs may be coupled to the distributed antenna 201 where the characteristic impedance may be matched to the desirable impedance for the device to be coupled. The antenna ports 205A-205H may comprise metal strips, for example, that may be electrically coupled to the distributed antenna 201.

In operation, PAs in the transceiver 152 with different output impedances and optimum power output may be coupled to the antenna ports 205A-205H to enable efficient power control. For example, a higher output impedance PA may be coupled to a high impedance antenna port, and a lower output impedance PA may be coupled to a low impedance antenna port. In this manner, an appropriate PA may be utilized for a desired power level as defined by the PA output power characteristics and associated output impedance. Thus, by integrating the distributed antenna 201 on the chip 162 and enabling appropriate PAs, the power efficiency of the wireless device 150 may be configured for optimum battery lifetime and RF output power performance.

Figure 3A:
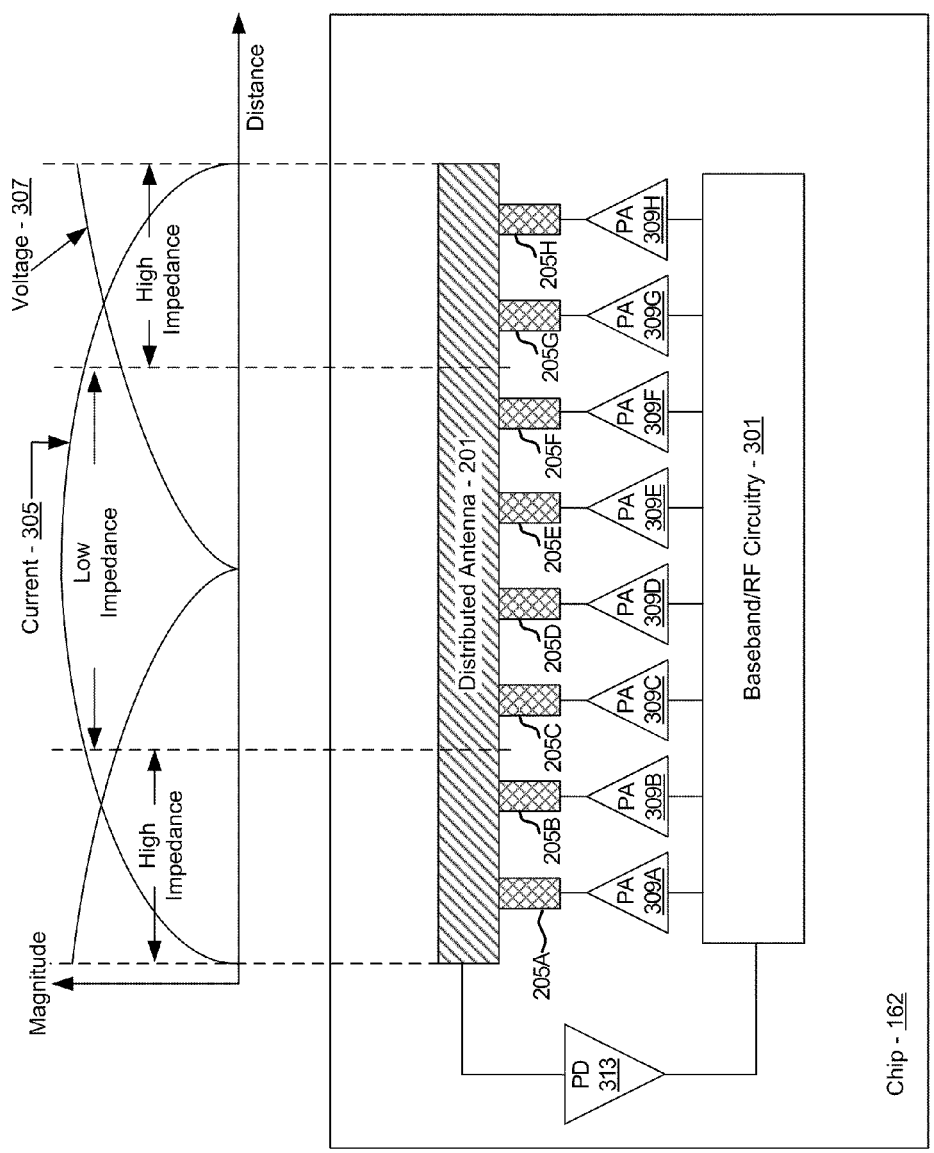
FIG. 3A is a block diagram illustrating a plan view of an exemplary multi-port distributed antenna on a chip, in accordance with an embodiment of the invention.

FIG. 3A is a block diagram illustrating a plan view of an exemplary multi-port distributed antenna on a chip, in accordance with an embodiment of the invention. Referring to FIG. 3A, there is shown the chip 162, the distributed antenna 201, the antenna ports 205A-205H, baseband/RF circuitry 301, power amplifiers (PAs) 309A-309H, and a power detector 313. There is also shown a current versus distance plot 305 and a voltage versus distance plot 307.

The baseband/RF circuitry 301 may comprise suitable, circuitry, logic and/or code that may be operable to process baseband and RF signals. Baseband signals may be down-converted received RF signals, or may be generated by input devices such as microphones, for example. The baseband/RF circuitry 301 may comprise the transceiver 152, the baseband processor 154, the processor 156, the CODEC 172, and the BT radio/processor 163, for example, described with respect to FIG. 1. Accordingly, the baseband/RF circuitry 301 may generate signals to be transmitted by the distributed antenna 201 via the PAs 309A-309H.

The PAs 309A-309H may comprise suitable circuitry, logic, and/or code that may be operable to amplify signals received from the baseband/RF circuitry 301 to be communicated to the distributed antenna 201. The PAs 309A-309H may comprise switches, such as CMOS transistors, for example, that may enable coupling and decoupling of one or more PAs to an antenna port.

The power detector 313 may comprise suitable circuitry, logic, and/or code that may be operable to detect the power level of an RF signal for transmission by the distributed antenna. The power detector 313 may comprise an envelope detector, such as a diode, for example, and may communicate a power level signal to the baseband/RF circuitry 301 for tuning of the output power to a desired level.

The current versus distance plot 305 may represent the magnitude of current across the length of the distributed antenna 201. Similarly, the voltage versus distance plot 307 may represent the magnitude of voltage across the length of the distributed antenna 201. The current and voltage at a given point on a distributed antenna may be dependant on the frequency of signals to be transmitted and/or received, the conductivity of the metal and the dielectric constant between the antenna and a ground plane, and by the physical dimensions of the antenna.

The number of antenna ports 205A-105H is not limited to the number shown in FIGS. 2 and 3A. Accordingly, any number of ports and amplifiers may be utilized depending on the desired output power of the distributed antenna 201 and the amount of power available from each PA 309A-309H, for example.

In operation, RF signals may be generated by the baseband/RF circuitry 301 for transmission by the distributed antenna 201. The baseband/RF circuitry 301 may communicate the signal over a plurality of paths to the distributed antenna 201 via the PAs 309A-309H. The characteristic impedance at each port may be a function of the position along the length of the distributed antenna 201, as indicated by the exemplary current versus distance plot 305 and the voltage versus distance plot 307.

In an embodiment of the invention, the number and location of the PAs 309A-309H enabled along the distributed antenna 201 may enable configuration of the power efficiency of the output power radiated by the distributed antenna 201. Accordingly, higher output power PAs with lower output impedances may be coupled to low impedance ports such as the antenna ports 205C-205F, where the voltage divided by the current is low, as indicated by the voltage versus distance plot 307 and the current versus distance plot 305. This is shown further with respect to FIGS. 3B and 3C. The power detector 313 may monitor the output power of the signal transmitted by the distributed antenna 201 and may provide a feedback path to the baseband/RF circuitry 301.

Figure 3B:
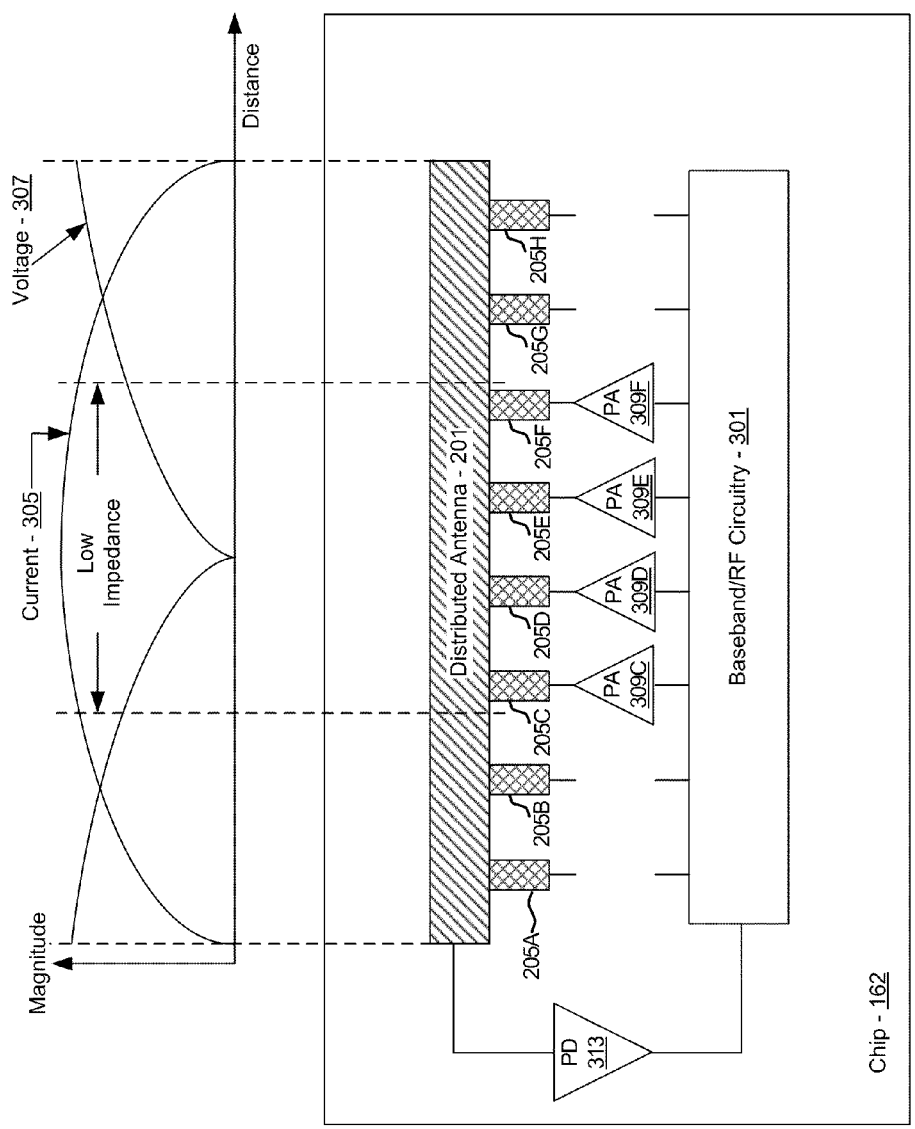
FIG. 3B is a block diagram illustrating a plan view of an exemplary multi-port distributed antenna in high power mode, in accordance with an embodiment of the invention.

FIG. 3B is a block diagram illustrating a plan view of an exemplary multi-port distributed antenna in high power mode, in accordance with an embodiment of the invention. Referring to FIG. 3B, there is shown the chip 162, the distributed antenna 201, the antenna ports 205A-205H, baseband/RF circuitry 301, power amplifiers (PAs) 309C-309F, the power detector 313, the current versus distance plot 305, and the voltage versus distance plot 307 of FIG. 3A.

In an exemplary high power operation, the PAs 309C-309F, which may be configured so that they are optimized for high power operation and may comprise low output impedance, may be enabled by the baseband/RF circuitry 301. RF signals may be generated by the baseband/RF circuitry 301 and may be amplified by the PAs 309C-309F before being communicated to the distributed antenna 201 via the antenna ports 205C-205F. In an exemplary embodiment of the invention, the PAs 309C-309F may comprise low output impedances that may correspond with the lower output impedance antenna ports 205C-205F, as indicated in the current and voltage versus distance plots 305 and 307, thus resulting in efficient coupling of higher output powers, resulting in enhanced performance and improved battery lifetime of the wireless device 150.

Figure 3C:
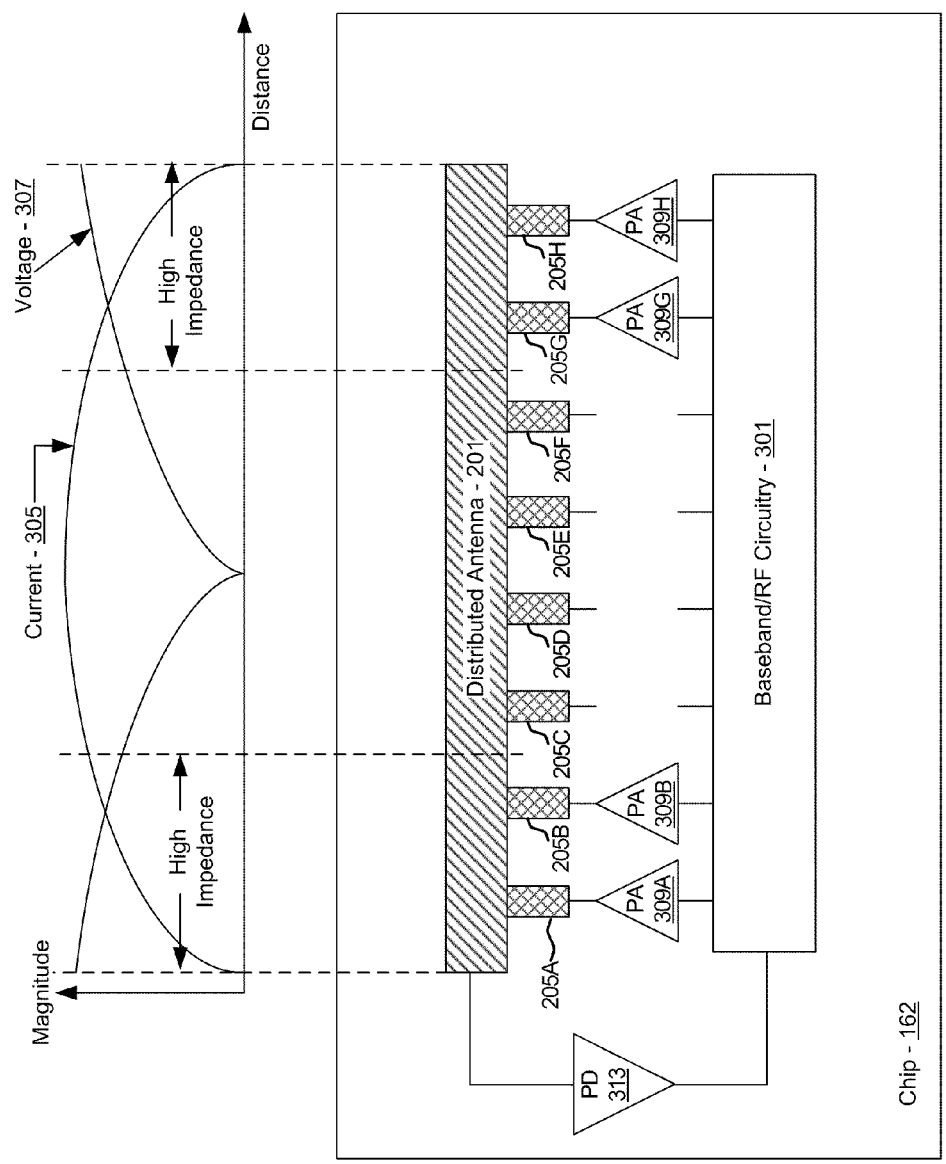
FIG. 3C is a block diagram illustrating a plan view of an exemplary multi-port distributed antenna in low power mode, in accordance with an embodiment of the invention.

FIG. 3C is a block diagram illustrating a plan view of an exemplary multi-port distributed antenna in low power mode, in accordance with an embodiment of the invention. Referring to FIG. 3C, there is shown the chip 162, the distributed antenna 201, the antenna ports 205A-205H, baseband/RF circuitry 301, the PAs 309A, 309B, 309G, and 309H, the power detector 313, the current versus distance plot 305, and the voltage versus distance plot 307 of FIG. 3A.

In an exemplary low power operation, the PAs 309A, 309B, 309G, and 309H, which may be optimized for low power operation and may comprise high output impedance, may be enabled by the baseband/RF circuitry 301. RF signals may be generated by the baseband/RF circuitry 301 from input sources such as dual digital microphone 176, for example, and may be amplified by the PAs 309A, 309B, 309G, and 309H before being communicated to the distributed antenna 201 via the antenna ports 205A, 205B, 205G, and 205H. In an exemplary embodiment of the invention, the PAs 309A, 309B, 309G, and 309H may comprise high output impedances that may correspond with the higher output impedance antenna ports 205A, 205B, 205G, and 205H, as indicated in the current and voltage versus distance plots 305 and 307, thus resulting in efficient coupling of lower output powers, resulting in enhanced performance and improved battery lifetime of the wireless device 150.

Figure 4:
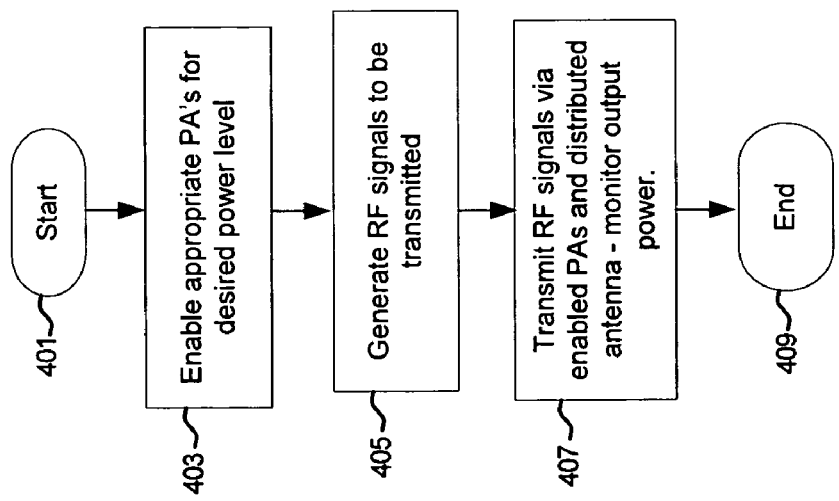
FIG. 4 is a flow chart illustrating exemplary steps for power control with optimum power efficiency with a multiport distributed antenna, in accordance with an embodiment of the invention.

FIG. 4 is a flow chart illustrating exemplary steps for power control with optimum power efficiency with a multiport distributed antenna, in accordance with an embodiment of the invention. Referring to FIG. 4, in step 403 after start step 401, the PAs 309A-309H optimized for the desired output power level may be enabled by the baseband/RF circuitry 301 to transmit signals to the distributed antenna 201 via the appropriate antenna ports 205A-205H. In step 405, RF signals may be generated by the baseband/RF circuitry 301 from one or more signals received from input devices such as the dual digital microphone 176 or the external headset 166, for example. In this regard, the baseband/RF circuitry 301 may process received input signals and up-convert the signals to RF frequencies for transmission. In step 407, RF signals may be amplified by the enabled PAs 309A-309H and transmitted by the distributed antenna 201. The output power of the distributed antenna 201 may be monitored by the power detector 313, and a power level signal may be communicated to the baseband/RF circuitry 301 for power level monitoring and adjusting, followed by end step 409.

In an embodiment of the invention, a method and system are disclosed for selectively enabling one or more power amplifiers 309A-309H coupled to a multi-port distributed antenna 201 in a wireless device 150. The selective enabling may be based on a desired output power radiated from the multi-port distributed antenna 201, and the power amplifiers 309A-309H may be coupled to ports on the multi-port distributed antenna 201 based on an output impedance of the power amplifiers 309A-309H and a characteristic impedance of the ports on the multi-port distributed antenna 201. Each of the power amplifiers 309A-309H may be configured for maximum efficiency in different output power ranges. The output power ranges may be inversely proportional to the output impedance of the power amplifiers 309A-309H. The output power may be monitored utilizing a power detector 313 coupled to the multi-port distributed antenna 201. The power detector 313 may comprise an envelope detector, such as a diode. The multi-port distributed antenna 201 may be integrated on a chip 162 with the one or more power amplifiers 309A-309H or may be located external to the chip 162. The multi-port distributed antenna 201 may comprise a microstrip antenna. RF signals may be transmitted via the one or more selectively enabled power amplifiers 309A-309H and the multi-port distributed antenna 201.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for power control with optimum power efficiency with a multi-port distributed antenna.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for enabling communication, the method comprising:
   in a wireless device, selectively enabling one or more power amplifiers coupled to a multi-port distributed antenna, wherein:
   said selective enabling is based on a desired output power radiated from said multi-port distributed antenna; and
   said power amplifiers are coupled to one or more ports on said multi-port distributed antenna based on an output impedance of said power amplifiers and a characteristic impedance of said ports on said multi-port distributed antenna.

2. The method according to claim 1, wherein each of said one or more power amplifiers is configured for maximum efficiency in different output power ranges.

3. The method according to claim 2, wherein said output power ranges are inversely proportional to said output impedance of said power amplifiers.

4. The method according to claim 1, comprising monitoring said output power utilizing a power detector coupled to said multi-port distributed antenna.

5. The method according to claim 4, wherein said power detector comprises an envelope detector.

6. The method according to claim 5, wherein said envelope detector comprises a diode.

7. The method according to claim 1, wherein said multi-port distributed antenna is integrated on a chip with said one or more power amplifiers.

8. The method according to claim 7, wherein said distributed antenna is located external to said chip.

9. The method according to claim 1, wherein said multi-port distributed antenna comprises a microstrip antenna.

10. The method according to claim 1, comprising transmitting RF signals via said one or more selectively enabled power amplifiers and said multi-port distributed antenna.

11. A system for enabling communication, the system comprising:
    one or more circuits for use in a wireless device, said one or more circuits comprising a plurality of power amplifiers, and said plurality of power amplifiers are coupled to a single distributed antenna via a plurality of antenna ports, wherein:
    said one or more circuits are operable to selectively enable one or more of said power amplifiers coupled to a multi-port distributed antenna, wherein:
    said selective enabling is based on a desired output power radiated from said multi-port distributed antenna; and
    said power amplifiers are coupled to said antenna ports based on an output impedance of said power amplifiers and a characteristic impedance of said ports on said multi-port distributed antenna.

12. The system according to claim 11, wherein each of said one or more power amplifiers is configured for maximum efficiency in different output power ranges.

13. The system according to claim 12, wherein said output power ranges are inversely proportional to said output impedance of said power amplifiers.

14. The system according to claim 11, wherein said one or more circuits comprise a power detector coupled to said multi-port distributed antenna, and said power detector is operable to monitor said output power.

15. The system according to claim 14, wherein said power detector comprises an envelope detector.

16. The system according to claim 15, wherein said envelope detector comprises a diode.

17. The system according to claim 11, wherein said multi-port distributed antenna is integrated on a chip with said one or more power amplifiers.

18. The system according to claim 17, wherein said distributed antenna is located external to said chip.

19. The system according to claim 11, wherein said multi-port distributed antenna comprises a microstrip antenna.

20. The system according to claim 11, wherein said one or more circuits are operable to transmit RF signals via said one or more selectively enabled power amplifiers and said multi-port distributed antenna.

* * * * *